United States Patent
Oberg et al.

(10) Patent No.: US 9,165,601 B2
(45) Date of Patent: *Oct. 20, 2015

(54) METHOD AND APPARATUS FOR DECODING AND CORRECTING A FIRST BYTE BASED ON A STATUS OF A SECOND BYTE ADJACENT TO THE FIRST BYTE AND IN RESPONSE TO A FAILURE TO DECODE THE FIRST BYTE

(71) Applicant: Marvell World Trade LTD., St. Michael (BB)

(72) Inventors: Mats Oberg, San Jose, CA (US); Jin Xie, Longmont, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 14/202,055

(22) Filed: Mar. 10, 2014

(65) Prior Publication Data
US 2014/0189467 A1 Jul. 3, 2014

Related U.S. Application Data

(63) Continuation of application No. 13/556,466, filed on Jul. 24, 2012, now Pat. No. 8,671,328.

(60) Provisional application No. 61/523,775, filed on Aug. 15, 2011.

(51) Int. Cl.
*H03M 13/00* (2006.01)
*G11B 20/18* (2006.01)
*H03M 13/29* (2006.01)

(52) U.S. Cl.
CPC ........ *G11B 20/1833* (2013.01); *G11B 20/1866* (2013.01); *H03M 13/2954* (2013.01); *G11B 2020/1846* (2013.01)

(58) Field of Classification Search
CPC .............. H03M 13/151; H03M 13/15; H03M 13/1515; H03M 13/29; H03M 13/1105; H03M 13/3707; H03M 13/373; H03M 13/1948; H03M 13/3746; H03M 13/2957; G11B 2020/1846; G11B 20/1833; H04L 1/005; H04L 1/0057
USPC ......... 714/784, 755, 785, 752, 769, 762, 774, 714/763, 756
See application file for complete search history.

(56) References Cited

U.S. PATENT DOCUMENTS 7,684,480 B2 * 3/2010 Kelly et al. .................... 375/229
7,890,844 B2 * 2/2011 Jeong et al. .................... 714/784

(Continued)

OTHER PUBLICATIONS

Good Error Correcting Codes Based on Very Soarse Matrices, (by David J. Mackay, IEEE Transaction of information theory, vol. 47, No. 2 pp. 638-656, Feb. 2001).

(Continued)

*Primary Examiner* — Albert Decady
*Assistant Examiner* — Osman Alshack

(57) ABSTRACT

A decoder including a decode module, a matrix module, and a marking module. The decode module receives data and performs a first decoding iteration to decode the data. The first decoding iteration includes generating a first matrix having a first byte. The matrix module generates a second matrix based on the first matrix. The second matrix includes the first and second bytes. The second byte is adjacent and sequentially prior or subsequent to the first byte. The marking module: determines whether the first byte has been correctly decoded; based on determining whether the first byte has been correctly decoded, determines a status of the second byte; and based on the status of the second byte, marks the first byte as an erasure. The decode module, based on the second byte being marked as an erasure, corrects the second byte during the second decoding iteration.

20 Claims, 9 Drawing Sheets

(56) References Cited

U.S. PATENT DOCUMENTS

| | | | |
|---|---|---|---|
| 8,046,659 B1* | 10/2011 | Liu | 714/752 |
| 8,051,357 B1* | 11/2011 | Varnica | 714/752 |
| 8,271,862 B2 | 9/2012 | Kobayashi | |
| 2007/0089038 A1* | 4/2007 | Xu et al. | 714/776 |
| 2007/0260966 A1* | 11/2007 | Kim et al. | 714/800 |
| 2008/0034272 A1* | 2/2008 | Wu et al. | 714/763 |
| 2010/0100789 A1* | 4/2010 | Yu et al. | 714/752 |
| 2010/0211857 A1* | 8/2010 | Kobayashi | 714/784 |
| 2010/0293431 A1* | 11/2010 | Liu et al. | 714/755 |
| 2010/0299575 A1* | 11/2010 | Roth et al. | 714/755 |
| 2012/0221914 A1 | 8/2012 | Moreno et al. | |

OTHER PUBLICATIONS

Efficient Encoding of Low-Density parity-Check Codes, (by T. Richardson, R Urbanke. IEEE, Transaction of information theory, vol. 47, No. 2 pp. 638-656, Feb. 2001.

* cited by examiner

| | | | | |
|---|---|---|---|---|
| 0 | 0 | 2 | 0 | 0 |
| 0 | 0 | 0 | 0 | 0 |
| 0 | 0 | 2 | 0 | 0 |
| 1 | 1 | 0 | 1 | 1 |
| 1 | 0 | 2$^e$ | 0 | 1 |
| 0 | 0 | 0 | 0 | 0 |
| 0 | 1 | 2$^e$ | 0 | 0 |
| 0 | 0 | 0 | 0 | 0 |
| 0 | 1 | 2$^e$ | 1 | 0 |
| 0 | 0 | 0 | 0 | 0 |
| 0 | 0 | 2$^e$ | 1 | 0 |

FIG. 5

METHOD AND APPARATUS FOR DECODING AND CORRECTING A FIRST BYTE BASED ON A STATUS OF A SECOND BYTE ADJACENT TO THE FIRST BYTE AND IN RESPONSE TO A FAILURE TO DECODE THE FIRST BYTE

CROSS-REFERENCE TO RELATED APPLICATIONS

The present disclosure is a continuation of U.S. patent application Ser. No. 13/556,466 (now U.S. Pat. No. 8,671, 328), filed Jul. 24, 2012. This application claims the benefit of U.S. Provisional Application No. 61/523,775, filed on Aug. 15, 2011. The entire disclosures of the above applications referenced above are incorporated herein by reference.

FIELD

The present disclosure relates to error correction code (ECC) of interleaved codewords.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Different types of read errors can occur in an optical recording system. Two error types are single (or random) errors and burst errors. Single errors affect one or two bytes of data and can be caused by noise, a micro defect (e.g. a small air bubble) in an optical storage medium, or by other causes of signal distortion. Signal distortion can also be caused by, for example, defocus in a read back laser, tilt in a read head, and/or off-track alignment of a read head. Burst errors are caused by defects in a medium due to surface imperfections. The surface imperfections may include scratches in the media and/or presence of foreign material (e.g., dirt, dust, and fingerprint residue) on surfaces of the media.

For Blu-ray Disc systems, an encoding process may be performed to aid in minimizing, correcting and/or eliminating read errors. As an example, the encoding process may include error correction coding user data to form an ECC block. This may include encoding the user data using a long-distance code (LDC) and encoding other data (e.g., address fields and control data) using a burst indicator subcode (BIS) (or picket code). A picket code includes sync patterns and a BIS. The LDC and BIS may be Reed-Solomon codes. As an example, 304 LDC codewords may be formed based on the user data. Each of the 304 LDC codewords may have, for example, 216 information symbols and 32 parity symbols.

The LDC codewords may then be used to form an ECC block. The ECC block may include, for example, 64 kilobytes of user data. The LDC codewords are arranged to form a first matrix with 304 columns, where each of the columns of the first matrix has a respective one of the LDC codewords. The first matrix may have 248 rows including the 216 information symbols (e.g., 216 symbols of encoded user data) and 32 parity symbols, where each row has 304 symbols (or bytes) of data.

The encoding process further includes interleaving the 304 codewords of the first matrix by two in a vertical direction to form a 496×152 byte block (or second matrix). Each column of the second matrix includes two codewords; the two codewords are interleaved along each of the columns (first interleaving process). Bytes of a first codeword are in 248 rows of a column and bytes of the second codeword are in the other 248 rows of the same column. The bytes of the first codeword and the second codeword are in alternating rows of the column, such that the bytes of the first codeword are every other row of the column and the bytes of the second codeword are in the remaining rows of the column.

In addition, a second interleaving process is performed including left shifting pairs of the rows of the second matrix in a predetermined pattern. Subsequent to the second interleaving process, equally spaced picket columns 10 (e.g., 4 picket columns) are inserted into the second matrix with the leftmost picket column 12 including a sync pattern to form a third matrix 14, as shown in FIG. 1. The sync pattern includes sync marks, which are included at a beginning of each row of the third matrix 14. Subsequent to the sync pattern, each of the rows may include the other three picket columns. Between each consecutive pair of picket columns is, for example, 38 columns of information symbols (or encoded user data) 16 and parity symbols 18. The $2^{nd}$-$4^{th}$ picket columns include BIS codewords. Each BIS codeword may have 30 information symbols (e.g., 30 symbols of encoded address fields and control data) and 32 parity symbols for a total codeword length of 62 bytes. A total of 24 BIS codewords may be interleaved into the $2^{nd}$-$4^{th}$ picket columns, where each of the $2^{nd}$-$4^{th}$ picket columns has 496 bytes. As a result, each row of the third matrix includes in the following order a sync mark, 38 LDC bytes, a BIS byte, 38 LDC bytes, a BIS byte, 38 LDC bytes, a BIS byte, and 38 LDC bytes.

In FIG. 1, S is a length of the sync mark in each row, U is a length of information or parity symbols between picket columns, and B is a length of BIS data in each picket column of each row. A length of each row minus the sync mark length S is identified as length$_R$. A length of a column of information symbols is identified as length$_L$. A length of a column of parity symbols is identified as length$_P$. An overall column length is identified as length$_C$.

Following ECC encoding, the codeword data of the resulting third matrix (or ECC block) is encoded using a modulation code. The modulation code may be, for example, a 17PP code used for Blu-ray recordings. The acronym "17PP" refers to constraints d and k used in the modulation code, where d is a minimum runlength and k is a maximum runlength. The constraints indicate minimum and maximum runlengths of bits that may occur in a channel bit stream. ECC encoded data provided as a result of the modulation encoding can be written to a storage medium (e.g., a disc) in a row-wise fashion (i.e. one row at a time).

The BIS codewords and the sync pattern can be used to identify bursts (strings) of incorrect user data when reading the ECC encoded data back from the storage medium. Examples of bursts are indicated in FIG. 1. For example, if bytes in two or more consecutive picket columns of a row are incorrect (or failed a decoding evaluation) then a burst may be assumed. The bytes between the two picket columns of that row are assumed to also be incorrect and are marked as erasures by creating erasure location pointers. In FIG. 1, three bursts X, Y, Z are identified. The first burst and the third burst are short and each includes two consecutive picket bytes. The second burst is long and includes eight picket bytes.

SUMMARY

A decoder is provided and includes a decode module, a matrix module, and a marking module. The decode module receives data and performs a first decoding iteration to decode the data. The first decoding iteration includes generating a first matrix having a first byte. The matrix module generates a second matrix based on the first matrix. The second matrix includes the first and second bytes. The second byte is adjacent and sequentially prior or subsequent to the first byte. The marking module: determines whether the first byte has been correctly decoded; based on determining whether the first byte has been correctly decoded, determines a status of the second byte; and based on the status of the second byte, marks the first byte as an erasure. The decode module, based on the second byte being marked as an erasure, corrects the second byte during the second decoding iteration.

In other features, a method is provided and includes: receiving data at a decoder; performing a first decoding iteration, via the decoder, to decode the data, where the first decoding iteration includes generating a first matrix, and where the first matrix includes a first byte; and generating a second matrix based on the first matrix. The second matrix includes the first byte and a second byte. The second byte is (i) adjacent and sequentially prior to the first byte, or (ii) adjacent and sequentially subsequent to the first byte. The method further includes: subsequent to the first decoding iteration, determining whether the first byte of the first matrix has been correctly decoded; based on determining whether the first byte of the first matrix has been correctly decoded, determining a status of the second byte; based on the status of the second byte, marking the first byte as an erasure; performing a second decoding iteration via the decoder; and based on the second byte being marked as an erasure, correcting the second byte during the second decoding iteration.

In other features, a decoding system is provided and includes a decoder, a first module and a second module. The decoder is configured to receive data read from an optical storage medium and perform a first decoding iteration and a second decoding iteration to decode the data. The first decoding iteration includes generating a resultant matrix. The first module is configured to, based on first decoding statuses of multiple bytes in the resultant matrix, determine second decoding statuses of bytes proximate to failed bytes of a feedback matrix. The feedback matrix is generated based on the resultant matrix. The first module is configured to mark selected ones of the failed bytes as erasures based on the second decoding statuses. The second module is configured to correct one or more of the bytes marked as erasures during the second decoding iteration.

In other features, the decoding system further includes a third module configured to evaluate the resultant matrix based on the first decoding statuses of the bytes in the resultant matrix and determine whether to perform the second decoding iteration based on the evaluation of the resultant matrix. The feedback matrix is a first feedback matrix. An interleave module is configured to interleave selected bytes of the resultant matrix to form a second feedback matrix during the second decoding iteration. An insert module is configured to insert columns in the second feedback matrix to form the first feedback matrix.

In other features, the decoding system further includes a third module configured to decode demodulated data to generate a first feedforward matrix during the first decoding iteration. The demodulated data is generated based on the data read from the optical storage medium. The third module or the first module is configured to determine erasures of the first feedforward matrix. A fourth module is configured to generate the resultant matrix based on the erasures of the first feedforward matrix.

In other features, the decoding system further includes a remove module configured to remove columns from the first feedforward matrix to generate a second feedforward matrix during the first decoding iteration. A deinterleave module is configured to deinterleave the second feedforward matrix to generate a third feedforward matrix. The second module is configured to decode the third feedforward matrix to generate the resultant matrix.

In other features, the decoding system further includes a remove module configured to remove columns from a first feedforward matrix to generate a second feedforward matrix during the second decoding iteration. The first feedforward matrix includes the feedback matrix. A deinterleave module is configured to deinterleave the second feedforward matrix to generate a third feedforward matrix. The second module is configured to decode the third feedforward matrix to generate a second resultant matrix. A third module is configured to determine whether to perform an additional decoding iteration based on decoding statuses of bytes in the second resultant matrix.

In other features, the first module is configured to mark the bytes in the second resultant matrix as corrected bytes or failed bytes. The third module is configured to evaluate the corrected bytes and the failed bytes of the second resultant matrix to determine whether to perform the additional decoding iteration.

In other features, the decoding system further includes a demodulation decoder configured to demodulate the data read from the optical storage medium to generate demodulated data. The decoder: is configured to receive the demodulated data and perform the first decoding iteration and the second decoding iteration to decode the demodulated data; and includes the first module and the second module.

In other features, a method is provided and includes receiving data read from an optical storage medium and performing a first decoding iteration and a second decoding iteration to decode the data. The first decoding iteration includes generating a resultant matrix. A feedback matrix is generated based on the resultant matrix. Based on first decoding statuses of multiple bytes in the resultant matrix, second decoding statuses of bytes proximate to failed bytes of the feedback matrix are determined. Selected ones of the failed bytes are marked as erasures based on the second decoding statuses. One or more of the bytes marked as erasures are corrected during the second decoding iteration.

In other features, the method further includes evaluating the resultant matrix based on first decoding statuses of the bytes in the resultant matrix. The method further includes determining whether to perform the second decoding iteration based on the evaluation of the resultant matrix. The feedback matrix is a first feedback matrix. Bytes of the resultant matrix are interleaved to form a second feedback matrix during the second decoding iteration. Columns are inserted in the second feedback matrix to form the first feedback matrix.

In other features, the method further includes removing columns from a first feedforward matrix to generate a second feedforward matrix during a third decoding iteration. The first feedforward matrix includes the feedback matrix. The second feedforward matrix is deinterleaved to generate a third feedforward matrix. The third feedforward matrix is decoded to generate a second resultant matrix. The method further includes determining whether to perform an additional decoding iteration based on decoding statuses of bytes in the second resultant matrix. The bytes in the second resultant matrix are marked as corrected bytes or failed bytes. The corrected bytes and the failed bytes of the second resultant matrix are evaluated to determine whether to perform the additional decoding iteration.

In other features, the method further includes deinterleaving columns of a first feedforward matrix during the first decoding iteration. Rows of the first feedforward matrix are shifted to generate a second feedforward matrix. Bytes of the second feedforward matrix are decoded to generate the resultant matrix. The feedback matrix is a first feedback matrix. Columns of the resultant matrix are interleaved to form a second feedback matrix without shifting rows of the resultant matrix. The first feedback matrix is generated based on the second feedback matrix. Columns from the second feedback matrix are removed to form the first feedforward matrix.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 5 is a portion of a flag table in accordance with the present disclosure;

DESCRIPTION

In optical recording systems, ECC encoding and decoding may be performed to minimize, correct and/or eliminate read errors. The ECC encoding process may include the insertion of picket rows to identify error locations in a matrix of data. During decoding, if bytes in two consecutive picket columns of a row are incorrect, codewords and bytes between the picket columns for that row are marked as being incorrect. This technique of identifying incorrect bytes may be inefficient because not all of the bytes between the picket columns may be incorrect. Some of the bytes may be correct. On the other hand, if bytes in two consecutive picket columns of a row are correct, some bytes between the picket columns for that row may be incorrect, but the incorrect bytes are not marked as being incorrect. The techniques disclosed herein more precisely pinpoint the bytes that are incorrect, mark the incorrect bytes as erasures, and then perform decoding to correct the erasures. The techniques minimize the number of bytes that are falsely marked as erasures and increase the number of erasures corrected. This increases ECC decoding accuracy.

An erasure refers to a byte that has failed a decoding evaluation process, or has been identified as an error. Location of the erasure is known and can be determined by a decoding module. An erasure is different than an error. Although an error also refers to a byte that has failed a decoding evaluation process, location of an error is unknown. During decoding, a certain number of erasures and/or errors can be corrected. Fewer errors can be corrected than erasures. The number of erasures and/or errors that can be corrected depends on a number of parity bytes available. A Reed-Solomon code which encodes k bytes to length n codewords with n–k parity bytes, can correct t<=(n–k)/2 errors, or n–k erasures, or a combination thereof. As an example, an ECC may have 6 parity bytes, and a minimum distance between valid codewords of 7 bytes. Based on this minimum distance, 6 erasure bytes may be corrected or 3 error bytes may be corrected. For this reason, by better identifying bytes as erasures, an increased number of bytes can be corrected.

Figure 2:
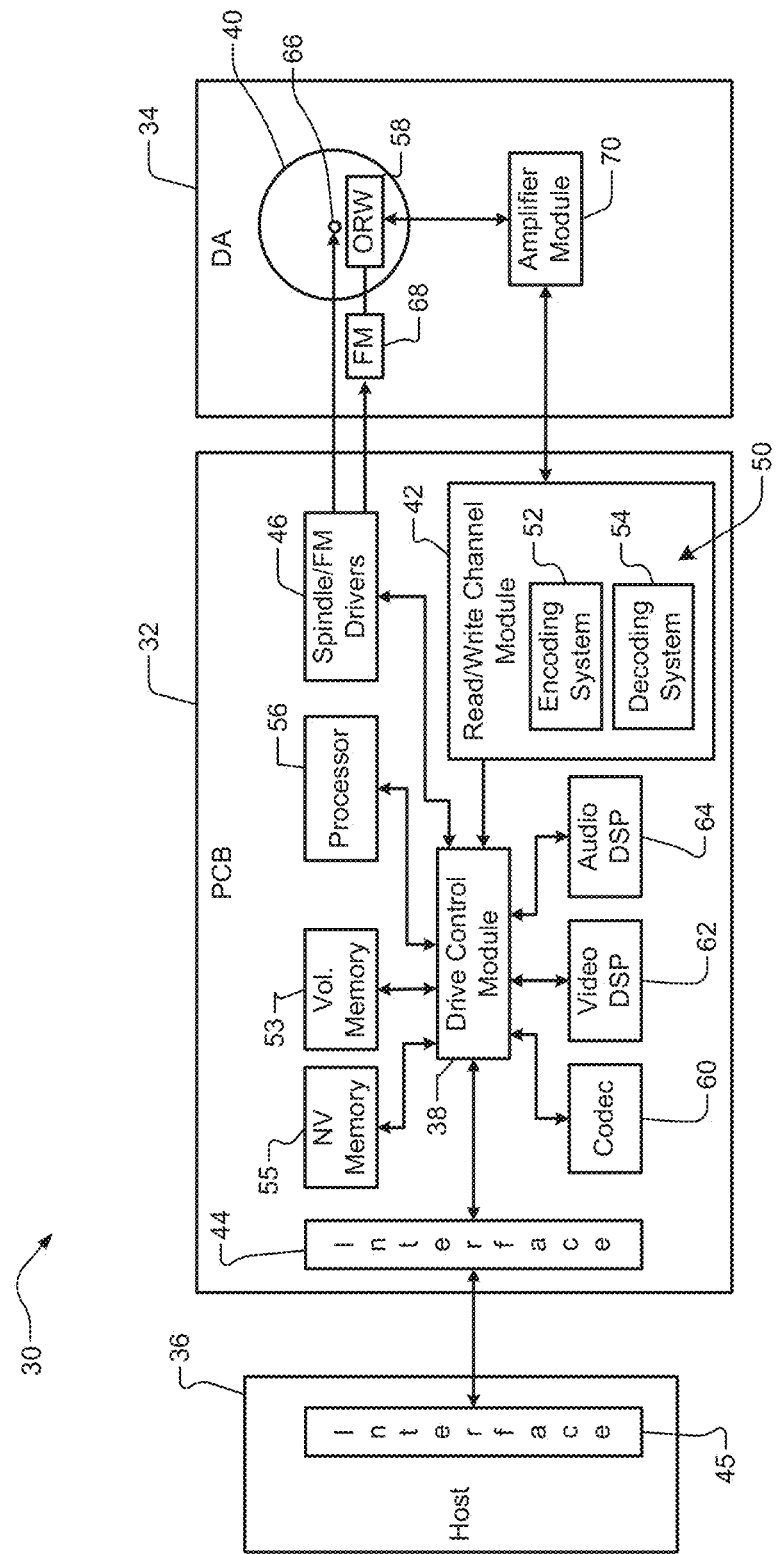
FIG. 2 is a functional block diagram of an optical storage drive incorporating an ECC decoder in accordance with the present disclosure.

In FIG. 2, an optical storage drive 30 is shown. The optical storage drive 30 may be, for example, a Blu-ray disc (BD) drive, a digital versatile disc (DVD) drive, or other storage device that implements an encoding technique including interleaved codewords. The optical storage drive 30 includes a printed circuit board (PCB) 32 and a drive assembly (DA) 34. The PCB 32 transfers data between the DA 34 and a host 36. The host 36 may be, for example, a computer, a multimedia device, a mobile computing device, etc. The PCB 32 may include a drive control module 38.

The drive control module 38 controls transfer of data between the DA 34 and the host 36. The drive control module 38 reads data from and writes data to a storage medium 40 of the DA 34 via a read/write channel module 42 and communicates with the host 36 via an input/output interface 44. The host 36 includes a corresponding input/output interface 45. The drive control module 38 coordinates timing of the read/write channel module 42, the input/output interface 44, and spindle/feed motor (FM) drivers 46 of the storage medium 40. Data is transferred between the drive control module 38 and the DA 34 via the read/write channel module 42 based on the coordinated timing.

The read/write channel module 42 includes an ECC system 50. The ECC system 50 includes an encoding system 52 and a decoding system 54. The encoding system 52 encodes bytes of the data being written to the storage medium 40 on the DA 34. The decoding system 54 decodes and corrects bytes of data received from the storage medium 40 by performing an iterative decoding process. During the iterative decoding process, codewords and/or bytes are iteratively decoded and evaluated until no further codewords and/or bytes can be corrected. Examples of the iterative decoding process are described in detail below with respect to FIGS. 3-9.

The PCB 32 may further include a buffer (or volatile memory) 53, a non-volatile memory 55, and a processor 56. The buffer 53 stores read data, write data and/or control code that is associated with controlling operation of the optical storage drive 30. The nonvolatile memory 55 may include flash memory and may store data related to drive write formats and/or other nonvolatile control code. The processor 56 may perform data and/or control processing that is related to the operation of the optical storage drive 30. The processor 56 may also perform decoding of copy protection and/or compression/decompression as needed.

During write operations, the read/write channel module 42 encodes data to be written by an optical read/write (ORW)

device 58 to the storage medium 40 or storage media (e.g., one or more disc(s)). The read/write channel module 42 processes read and write signals for reliability and may apply, for example, an ECC, a run-length-limited (RLL) code, and/or other suitable codes. During read operations, the read/write channel module 42 may convert an analog output of the ORW device 58 to a digital signal. The converted signal is then detected and decoded to recover the data that was previously written on the storage medium 40.

The PCB 32 may further include a codec module 60, a video digital signal processor (DSP) 62, and an audio DSP 64. The codec module 60 encodes and/or decodes video such as any of the Moving Picture Experts Group (MPEG) formats. The processors 62, 64 may be used to perform audio and/or video signal processing.

The DA 34 includes the storage medium 40 on which data is stored optically. The storage medium 40 is rotated by a spindle motor 66, which rotates based on signals from the spindle/FM drivers 46. The storage medium 40 is rotated at a controlled and/or variable speed during read/write operations. The ORW device 58 may include a laser and an optical sensor and may move relative to the storage medium 40 to read and/or write data to/from the storage medium 40.

The spindle/FM drivers 46 also generate control signals that position a feed motor 68, for example using a voice coil actuator, a stepper motor or any other suitable actuator. The feed motor 68 moves the ORW device 58 relative to the storage medium 40.

The DA 34 may further include an amplifier module 70. The amplifier module 70 may generate laser drive signals based on outputs of the read/write channel module 42. The amplifier module 70 may amplify read signals received from the ORW device 58. When reading data, the amplifier module 70 amplifies low level signals from the ORW device 58 and outputs the amplified signal to the read/write channel module 42.

Portions of the optical storage drive 30 may be implemented by one or more integrated circuits (IC) or chips. For example, the drive control module 38 and the processor 56 may be implemented by a single chip. The spindle/FM drivers 46 and/or the read/write channel module 42 may also be implemented by the same chip as the drive control module 38 and the processor 56. The components, modules, and processors of the PCB 32 may be implemented as a system-on-a chip (SOC).

Figure 3:
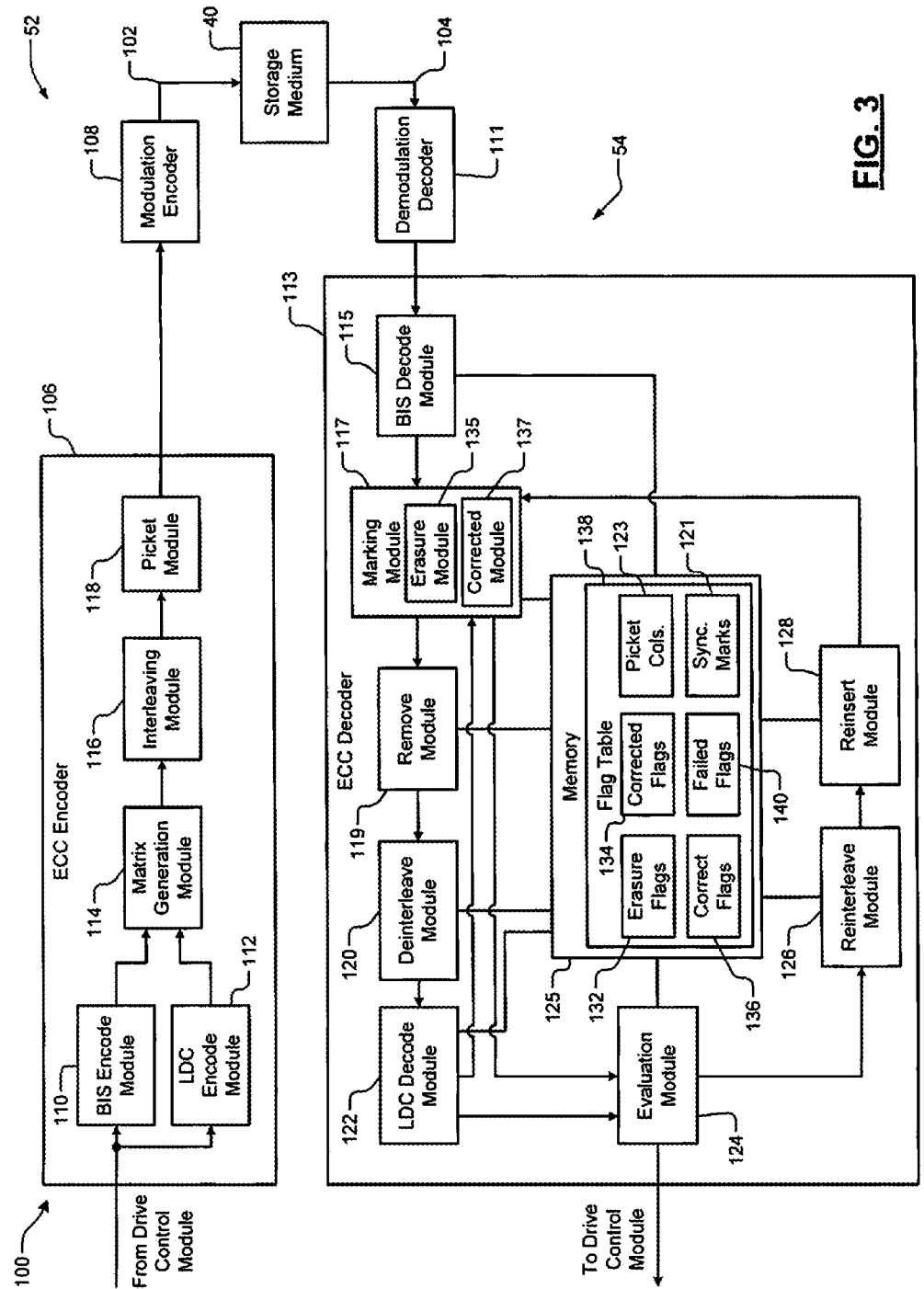
FIG. 3 is a functional block diagram of an ECC system in accordance with the present disclosure.

In FIG. 3, an ECC system 100 is shown. The ECC system 100 may replace the ECC system 50 of FIG. 2. The ECC system 100 may include the encoding system 52, a write channel 102, the storage medium 40, a read channel 104, and the decoding system 54. Data is encoded by the encoding system 52 and written to the storage medium 40 via the write channel 102. Data is read from the storage medium 40 and provided to the decoding system 54 via the read channel 104. The decoding system 54 iteratively decodes and corrects the data read from the storage medium 40.

The encoding system 52 includes an ECC encoder 106 and a modulation encoder 108. The ECC encoder 106 may include a burst indicator subcode (BIS) encode module (or first Reed-Soloman codeword module) 110, a long-distance code (LDC) encode module (or second Reed-Soloman codeword module) 112, a matrix generation module 114, an interleaving module 116, and a picket module 118. The BIS encode module 110 encodes address fields, control data, and/or other data to provided encoded BIS bytes (or encoded BIS symbols) and corresponding parity bytes (or BIS parity symbols). The LDC encode module 112 encodes user data to provide encoded LDC bytes (or encoded LDC symbols) and corresponding parity bytes (or LDC parity symbols). Outputs of the encode modules 110, 112 are provided to the matrix generation module 114, which generates a first encoding matrix. The first encoding matrix includes the encoded BIS data, the encoded LDC data, the BIS parity bytes, and the LDC parity bytes. As an example, the first encoding matrix may include 304 LDC codewords including 216 information symbols (e.g., 216 symbols of encoded user data) and 32 parity symbols. The first encoding matrix may have 248 rows including the 216 information symbols and 32 parity symbols, where each row has 304 symbols (or bytes) of data.

The interleaving module 116 may perform multiple levels of interleaving. A first interleaving level may include interleaving two or more columns of the first encoding matrix to form a second encoding matrix. As an example, the 304 codewords of the first encoding matrix may be interleaved by two in a vertical direction to form a 496×152 byte block (or the second encoding matrix). A second interleaving level may include left shifting two or more rows of the second encoding matrix in a predetermined pattern.

Figure 1:
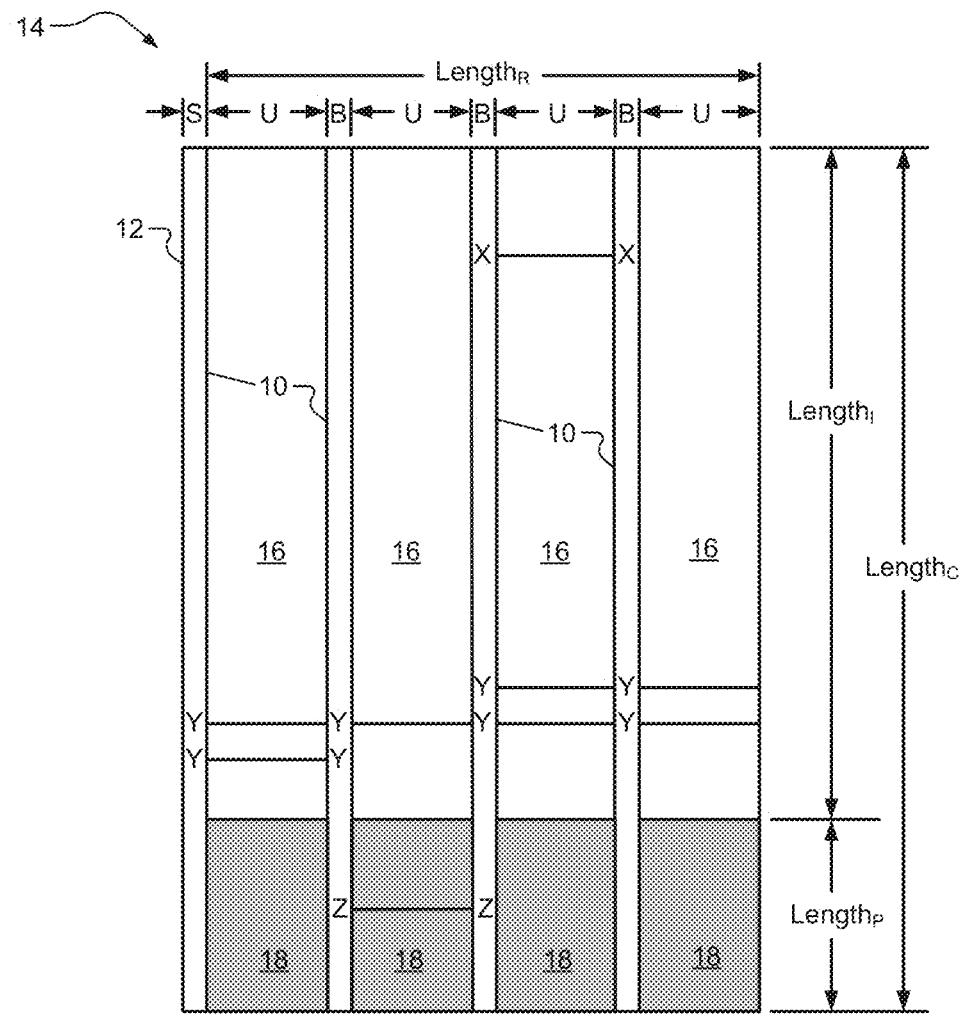
FIG. 1 illustrates an ECC block and corresponding erasures.

The picket module 118 inserts equally spaced picket columns (e.g., 4 picket columns) into the second encoding matrix with the leftmost picket column including a sync pattern to form a third encoding matrix. The sync pattern includes sync marks, which are included at a beginning of each row of the third encoding matrix. The $2^{nd}$-$4^{th}$ picket columns may include BIS codewords. Each BIS codeword may have 30 information symbols (e.g., 30 symbols of encoded address fields and control data) and 32 parity symbols for a total codeword length of 62 bytes. A total of 24 BIS codewords may be interleaved into the $2^{nd}$-$4^{th}$ picket columns, where each of the $2^{nd}$-$4^{th}$ picket columns has 496 bytes. Each of the $2^{nd}$-$4^{th}$ picket columns may include 8 BIS codewords. As a result, each row of the third encoding matrix includes in the following order a sync mark, 38 LDC bytes, a BIS byte, 38 LDC bytes, a BIS byte, 38 LDC bytes, a BIS byte, and 38 LDC bytes. An example of the third encoding matrix is shown in FIG. 1.

The modulation encoder 108 encodes the third encoding matrix and/or the output of the ECC encoder 106. Following ECC encoding, the third encoding matrix (or first ECC block) is encoded using a modulation code to generate a modulated signal. The modulation code may be, for example, a 17PP code used for Blu-ray recordings or other suitable modulation code. The encoded data provided in the modulated signal may be written to the storage medium 40 in a row-wise fashion (i.e. one row at a time) via the write channel 102.

The decoding system 54 includes a demodulation decoder 111 and an ECC decoder 113. The demodulation decoder 111 receives a read signal from the read channel 104 and/or an amplifier module (e.g., the amplifier module 70 of FIG. 2). The demodulation decoder 111 may perform 17pp decoding or other suitable demodulation decoding to generate a demodulated signal.

The ECC decoder 113 may be a soft-decision decoder and/or a hard-decision decoder. The ECC decoder 113 includes a BIS decode module 115, a marking module 117, remove module 119, a deinterleave module 120, a LDC decode module 122, an evaluation module 124, a reinterleave module 126, and a reinsert module 128. The BIS decode module 115 decodes a demodulated signal received from the read channel 104 to generate a first feedforward matrix (or second ECC block). The demodulated signal includes encoded BIS data, encoded LDC data, and corresponding parity bytes.

The BIS decode module 115 and/or the marking module 117 may generate erasure pointers based on the result of the BIS decoding. The erasure pointers may be determined based on sync marks 121 and/or BIS bytes in picket columns 123 in the first feedforward matrix. The sync marks and picket columns may be stored in a memory 125. The erasure pointers may identify LDC bytes of the demodulated signal that can be incorrect, determined based on a first decoding evaluation performed by the BIS decode module 115. Erasures for LDC bytes may be referred to as LDC erasures.

LDC erasures may be generated for the bytes in the row and between the two incorrect BIS bytes. As an alternative, LDC erasures may be generated for LDC bytes adjacent to the incorrect BIS bytes, proximate to the incorrect BIS bytes, and/or between the incorrect BIS bytes. The LDC erasures may not be between the incorrect BIS bytes. Bytes are adjacent to each other if the bytes are consecutive bytes. As an example, a first byte is adjacent to a second byte, if the first byte is consecutively before or after the second byte. No other bytes exist between adjacent bytes. Bytes are proximate each other if the bytes are in a series of bytes and are not more than a predetermined number of byte(s) away from each other.

The BIS decode module 115 and/or the marking module 117 may also generate corrected and/or correct pointers for BIS bytes of the first feedforward matrix based on the result of the BIS decoding. For example, corrected pointers may be generated for BIS bytes that have been corrected as a result of BIS decoding. Correct pointers may be generated for bytes that are correct. In one implementation, the corrected and correct pointers are not generated.

The erasure pointers, corrected pointers and correct pointers may include values or identifiers identifying a status of the corresponding bytes of the first feedforward matrix. For example, the erasure pointers may have a value of 2 or may be identified with an e, the corrected pointers may have a value of 1, and the correct pointers may have a value of 0. Each of the erasure pointers, corrected pointers and correct pointers may be stored as respective erasure, corrected, and correct flags 132, 134, 136 in a flag table 138. Entries (pointer values) in the flag table 138 may correspond to entries (bytes) in the first feedforward matrix. The flag table 138 may be stored in the memory 125 and may be accessible to each of the modules 115, 117, 119, 120, 122, 124, 126, 128 of the ECC decoder 113. As an alternative to generating and storing the flag table 132, pointers (or markings) generated by any of the modules 115, 117, 119, 120, 122, 124, 126, 128 in the ECC decoder 113 may be provided as bits and added to one or more of the matrices generated by the modules 115, 117, 119, 120, 122, 124, 126, 128.

The marking module 117 may include an erasure module 135 and a corrected module 137 for marking bytes as erasures (erasure bytes) and corrected (corrected bytes) based on results of the decoding iterations and/or matrices generated during the decoding iterations. A first decoding iteration may include: removing the picket columns from the first feedforward matrix to form the second feedforward matrix; deinterleaving the second feedforward matrix to form a third feedforward matrix; LDC decoding the third feedforward matrix to generate a resultant matrix; marking bytes of the resultant matrix; and evaluating markings associated with the resultant matrix. A second decoding iteration may include: reinterleaving the resultant matrix to form a first feedback matrix; reinserting picket columns in the first feedback matrix to form a second feedback matrix; marking bytes of the second feedback matrix; using the second feedback matrix and corresponding markings as an updated first feedforward matrix; removing picket columns of the updated first feedforward matrix to form an updated second feedforward matrix; deinterleaving the updated second feedforward matrix to form an updated third feedforward matrix; LDC decoding the updated third feedforward matrix to generate an updated resultant matrix; marking bytes of the updated resultant matrix; and evaluating the markings associated with the updated resultant matrix.

The second decoding iteration may be repeated for subsequent decoding iterations until no further codewords and/or bytes can be corrected. This is described in further detail with respect to FIGS. 4-9. During the decoding iterations, the marking module marks and/or modifies flags (or markings) for bytes in the matrices generated, as the bytes are maintained and/or corrected.

The remove module may remove picket columns from the first feedforward matrix to form a second feedforward matrix. The picket columns may be stored in the memory. The deinterleave module performs one or more levels of deinterleaving depending upon the implementation and the decoding iteration being performed. During a first decoding iteration, the deinterleave module may perform, for example, two levels of deinterleaving or as many levels of deinterleaving as there are levels of interleaving performed by the interleaving module. The first level of deinterleaving may include right shifting two or more rows of the third matrix in a predetermined pattern. The second level of deinterleaving may include deinterleaving columns of the second feedforward matrix to provide the third feedforward matrix, where each column in the third feedforward matrix includes a single codeword.

During decoding iterations subsequent to the first decoding iteration, the deinterleave module 120 performs one or more levels of deinterleaving. The number of levels of deinterleaving may be equal to the number of levels of interleaving performed by the reinterleave module 126. Any number of levels of interleaving and deinterleaving may be performed. If the deinterleaving module 120 performs the above-described two levels of deinterleaving in a first decoding iteration and only one level of deinterleaving is performed in a subsequent decoding iteration, then the task of right shifting rows of a matrix may not be performed. As a result, columns of an updated second feedforward matrix may be deinterleaved to provide an updated third feedforward matrix without right shifting rows of the updated second feedforward matrix. The method of FIG. 9 includes a single deinterleaving level for decoding iterations subsequent to the first decoding iteration.

The LDC decode module 122 decodes LDC codewords in the third feedforward matrix to provide user data in a resultant matrix. The LDC decode module 122 and/or the erasure module 135 may determine which of the LDC bytes did not decode and mark these bytes as failed bytes. Failed markings may be stored as failed flags 140 in the memory 125. The marking module 117 may then determine which ones of the failed bytes are to be marked as erasures. This is further described with respect to FIGS. 4-8. The erasures may be classified as described with respect to FIG. 6. The LDC decode module 122 and/or the corrected module 137 may also mark bytes that have been corrected by the LDC decode module 122 as corrected.

The evaluation module 124 evaluates the results of the LDC decoding and subsequent markings to determine whether to perform an additional decoding iteration. An additional decoding iteration may be performed to attempt to decode one or more remaining LDC codewords in the resultant matrix. If an additional decoding iteration is performed, the resultant matrix is provided along with the associated markings to the reinterleave module 126, otherwise the resultant matrix may be provided from the evaluation module 124 to the drive control module 38 of FIG. 2.

The reinterleave module 126 performs one or more levels of interleaving for each decoding iteration. If the reinterleave module 126 performs two or more levels of interleaving, the reinterleave module 126 may interleave columns of the resultant matrix and/or left shift rows of the resultant matrix to form the first feedback matrix. The interleaving tasks performed by the reinterleave module 126 may be similar to the interleave tasks performed by the interleave module. If the reinterleave module 126 performs only one level of interleaving, the reinterleave module 126 may interleave columns of the resultant matrix without left shifting rows of the resultant matrix to form the first feedback matrix. The method of FIG. 9 includes a single reinterleaving level for decoding iterations subsequent to the first decoding iteration.

The reinsert module 128 inserts picket columns in the first feedback matrix to form the second feedback matrix. The picket columns may be the same as or different than the picket columns removed from the first feedforward matrix. The picket columns may be generated based on the first feedback matrix using a picket or Reed-Solomon code.

The ECC system 100 may be operated using numerous methods, example methods are illustrated in FIGS. 4 and 6-9. The below-described tasks of FIGS. 4 and 6-9 are meant to be illustrative examples; the tasks may be performed sequentially, synchronously, simultaneously, continuously, during overlapping time periods or in a different order depending upon the application and the decoding iteration. Also, any of the tasks may not be performed or skipped depending on the implementation and/or sequence of events.

Figure 4:
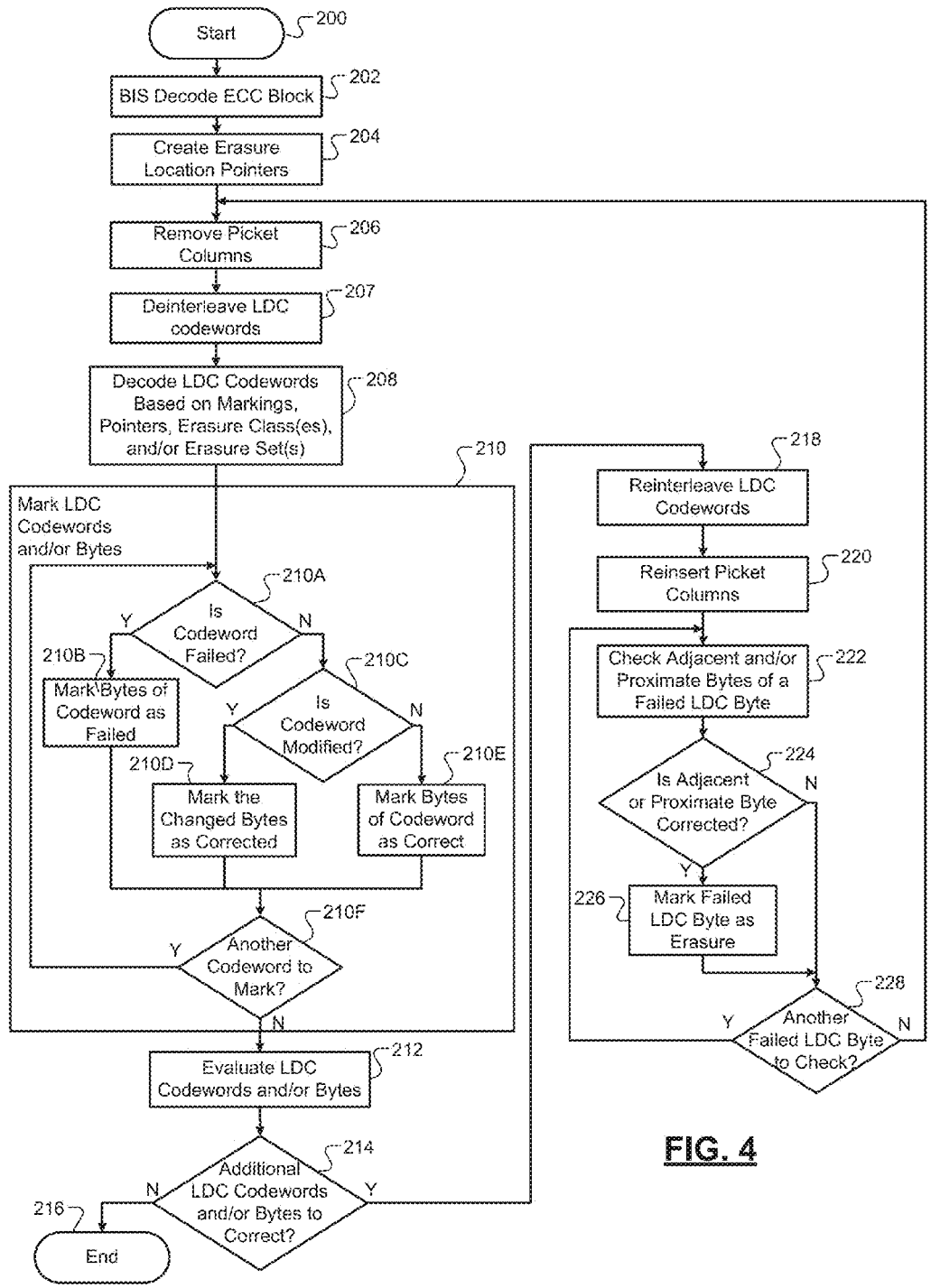
FIG. 4 illustrates an ECC decoding method in accordance with the present disclosure.

In FIG. 4, an ECC decoding method is shown. The ECC decoding method includes performing one or more decoding iterations to successfully decode LDC codewords. LDC codewords provided during each of the decoding iterations are evaluated prior to performing subsequent decoding iterations. Subsequent decoding iterations are performed based on results of the evaluation. The subsequent decoding iterations include reinterleaving LDC codewords, reinserting picket columns, checking adjacent and/or proximate bytes of failed LDC bytes, and marking failed LDC bytes as erasures.

Although the following tasks are primarily described with respect to the implementations of FIGS. 2-3, the tasks may be easily modified to apply to other implementations of the present disclosure. The tasks may be iteratively performed. The method may begin at 200.

At 202, the BIS decode module 115 decodes BIS codewords in the demodulated signal received from the demodulation decoder 111 to generate the first feedforward matrix (or ECC block). At 204, BIS decode module 115 and/or the marking module 117 creates erasure location pointers (or erasures) based on the first feedforward matrix. The erasures may be generated based on bytes in picket columns of the first feedforward matrix. The bytes in the picket columns may include sync marks of a sync pattern and BIS bytes. This may include generating the flag table 138 or portions of the flag table 138 and storing the flag table 138 or portions of the flag table 138 in the memory 125.

At 206, the remove module 119 may remove picket columns from the first feedforward matrix to form a second feedforward matrix. At 207, the deinterleave module 120 deinterleaves the second feedforward matrix to generate the third feedforward matrix. This may include one or more levels of deinterleaving depending upon the decoding iteration, as described above.

At 208, the LDC decode module 122 decodes LDC codewords of the third feedforward matrix to generate the resultant matrix. This decoding may be performed based on the markings and/or pointers generated at for example, 204, 210, 226 and/or at other marking tasks, such as marking tasks described with respect to FIGS. 6-9. The LDC decode module 122 may also decode the LDC codewords based on one or more selected erasure class(es), as further described with respect to FIGS. 6-7. The LDC decode module 122 may also decode the LDC codewords based on one or more selected set(s) of erasures, as further described with respect to FIG. 8.

At 210, the LDC decode module 122, the marking module 117 and/or the evaluation module 124 may mark LDC codewords and/or LDC bytes of the resultant matrix as failed or corrected to indicate the decoding statuses of the bytes. In one implementation, all LDC bytes of the resultant matrix are reviewed and/or marked. In another implementation, LDC bytes with a status change are reviewed and marked while other LDC bytes are not reviewed and/or marked. Bytes that are not marked as failed or corrected may be maintained in a current marked or unmarked state and/or be maintained in a marked state of correct.

The following tasks 210A-210F are provided as an example, and may be altered depending upon the marking strategy used. For description purposes, tasks 210A-210F are described with respect to the marking module 117, but may be performed by the LDC decode module 122 and/or the evaluation module 124. In 210A, the marking module 117 determines whether a current LDC codeword has been failed. If the codeword has been failed, task 210B is performed, otherwise task 210C is performed. At 210B, all bytes of the codeword are marked as Failed. At 210C, the marking module 117 determines whether the LDC codeword has been modified. If the current version of the codeword as provided during a current decoding iteration is different than a previous version of the codeword as provided during a decoding iteration performed prior to the current decoding iteration, task 210D is performed, otherwise task 210E is performed. At 210D, the bytes that had been changed are marked as Corrected. At 210E, all bytes of the codeword are marked as Correct. At 210F, the marking module 117 determines whether there is another LDC codeword to review.

At 212, the evaluation module 124 evaluates the LDC codewords and/or LDC bytes of the resultant matrix based on the markings of the bytes. At 214, the evaluation module 124 determines whether there is another LDC codeword to attempt to decode. If there is not another LDC codeword to decode, the method may end at 216 and the resultant matrix may be sent to the drive control module 38. If there is another or LDC codeword to decode, task 218 may be performed.

At 218, the reinterleave module 126 interleaves the resultant matrix to form the first feedback matrix. The reinterleave module 126 may perform one or more levels of interleaving, as described above. At 220, the reinsert module 128 inserts picket columns into the first feedback matrix to generate the second feedback matrix. The picket columns may be the same as the picket columns removed at 206.

At 222, the marking module 117 checks adjacent and/or proximate (BIS or LDC) bytes of a failed LDC byte selected to be corrected. The marking module 117 determines which of the adjacent bytes and/or proximate bytes have been corrected, are marked as failed bytes, and/or are erasures. Bytes that are correct may be marked with a value of 0, bytes that have been corrected may be marked with a value of 1, bytes that are failed may be marked with a value of 2, and bytes that are erasures may be marked with an e.

At 224, the marking module 117 may determine whether one or more adjacent and/or proximate bytes of the failed LDC byte are corrected. If one or more adjacent and/or proximate bytes have been corrected, task 226 may be performed, otherwise task 228 is performed. At 226, the failed LDC byte is marked as an erasure.

Referring now also to FIG. 5, a portion of a flag table is shown illustrating marking changes for failed bytes. In FIG. 5, five columns and eleven rows of flags are shown for bytes of a matrix. Four bytes are erased based on respective adjacent and proximate bytes. For example, in the fifth row and $3^{rd}$ column, a marking is changed from a 2 to an e, as two proximate markings are identified with a 1 indicating that the corresponding bytes have been corrected. The other three bytes that are corrected in the $7^{th}$, $9^{th}$, and $11^{th}$ rows are erased due to one or more adjacent markings being a 1. Other examples of conditions (or classes) for determining whether to change a failed marking to an erasure marking are described with respect to FIG. 6.

Referring again to FIG. 4, at 228, the marking module 117 determines whether there is another failed byte to check. If there is another failed byte to check, task 222 is performed, otherwise task 206 is performed.

Figure 6:
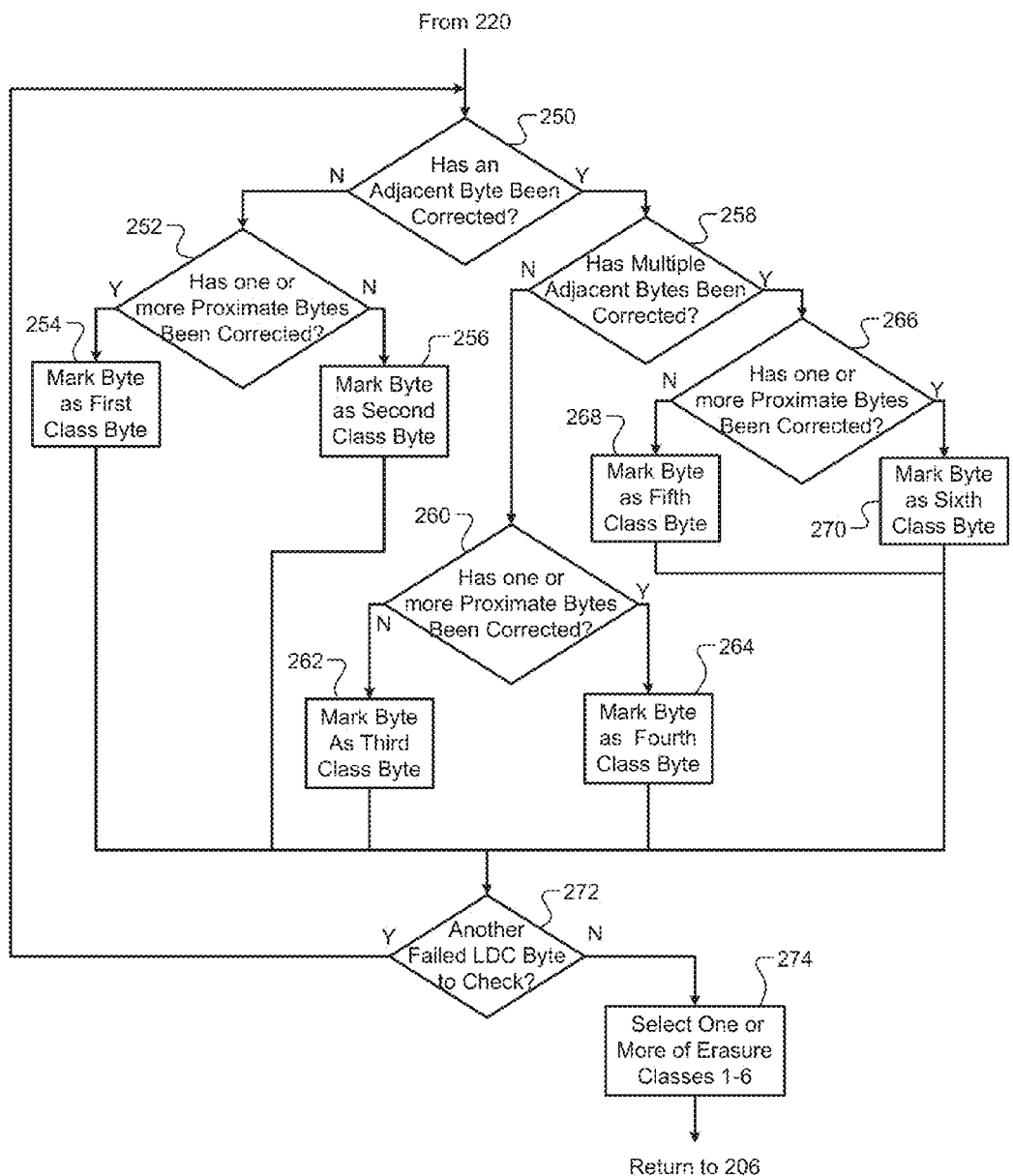
FIG. 6 illustrates an erasure class identification method in accordance with the present disclosure.

In FIG. 6, an erasure class identification method is shown. The tasks of FIG. 6 may be performed instead of tasks 222-228 of FIG. 4. Although the following tasks are primarily described with respect to the implementations of FIGS. 2-4, the tasks may be easily modified to apply to other implementations of the present disclosure. The tasks may be iteratively performed.

At 250, the marking module 117 may determine whether an adjacent byte of a failed LDC byte has been corrected. If an adjacent has not been corrected, task 252 is performed, otherwise task 258 is performed. At 252, the marking module 117 determines whether one or more bytes proximate to the failed LDC byte have been corrected. If one or more bytes proximate to the failed LDC byte have been corrected, task 254 is performed, otherwise task 256 is performed. At 254, the marking module 117 may mark the failed LDC byte as a first class erasure. At 256, the marking module 117 may mark the failed LDC byte as a second class erasure.

At 258, the marking module 117 determines whether multiple bytes adjacent to the failed LDC byte have been corrected. If multiple bytes adjacent to the failed LDC byte have not been corrected, task 260 is performed, otherwise task 266 is performed.

At 260, the marking module 117 determines whether one or more bytes proximate to the failed LDC byte have been corrected. If one or more bytes proximate to the failed LDC byte have not been corrected, task 262 is performed, otherwise task 264 is performed. At 262, the marking module 117 marks the failed LDC byte as a third class erasure. At 264, the marking module 117 marks the failed LDC byte as a fourth class erasure.

At 266, the marking module 117 determines whether one or more bytes proximate to the failed LDC byte have been corrected. If one or more bytes proximate to the failed LDC byte have not been corrected, task 268 is performed, otherwise task 270 is performed. At 268, the marking module 117 marks the failed LDC bytes as a fifth class erasure. At 270, the marking module 117 marks the failed LDC bytes as a sixth class erasure.

At 272, the marking module 117 determines whether another failed LDC byte is to be checked. If another failed LDC byte is to be checked, task 250 is performed, otherwise task 274 is performed. At 274, the marking module 117 or the LDC decode module 122 may select one or more erasure classes based upon which a current or next LDC decoding iteration is to be performed. As an example, the erasure classes may be ranked based on priority, with a highest erasure class being used in a current or next LDC decoding iteration and a next highest erasure class being used in a subsequent LDC decoding iteration. For each decoding iteration, a different erasure class or set of erasure classes may be used. Not all of the erasure classes may be used. If after a decoding iteration there are no further LDC bytes to correct, LDC decoding may end without performing LDC decoding based on unused erasure classes.

The erasure classes determined during the above-described method may be stored in the memory and accessed by the LDC decode module 122 and used when decoding LDC bytes.

Figure 7:
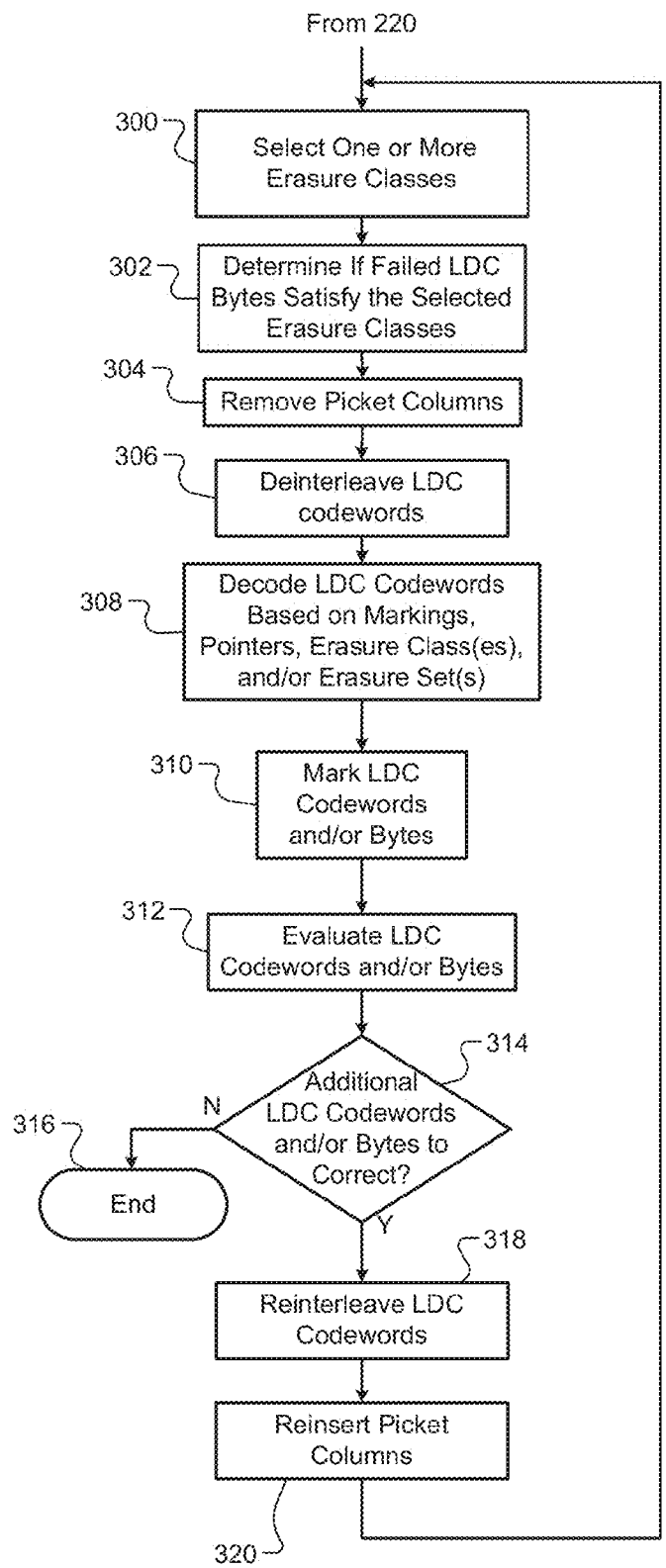
FIG. 7 illustrates an ECC decoding method incorporating erasure class selection in accordance with the present disclosure.

In FIG. 7, another ECC decoding method incorporating erasure class selection is shown. The following tasks may be performed instead of tasks 222-228 of FIG. 4. Although the following tasks are primarily described with respect to the implementations of FIGS. 2-4, the tasks may be easily modified to apply to other implementations of the present disclosure. The tasks may be iteratively performed.

At 300, the marking module 117, the LDC decode module 122, and/or the evaluation module 124 may select one or more erasure classes and/or modify a previously selected set of erasure class(es). During a first iteration of task 300, a set of one or more erasure class(es) may be selected. During iterations of task 300 subsequent to the first iteration of task 300, one or more erasure classes may be added to and/or removed from the set. Each of the erasure classes may have an associated condition. Failed LDC bytes that satisfy a condition of an erasure class satisfies that erasure class. For example, Class 1 erasures may have one or more corrected proximate bytes and no corrected adjacent bytes. As another example, Class 2 erasures may have a corrected adjacent byte, but not corrected proximate bytes. Various classes and associated conditions may be used. Additional examples of erasure classes are provided in FIG. 6. The classes may also be based on whether one or more adjacent and/or proximate bytes are marked as failed.

At 302, the marking module 117 determines which ones of the failed LDC bytes satisfy the one or more erasure class(es) in the selected set of erasure class(es). The marking module 117 may store this information and/or provide this information to the LDC decode module 122.

At 304, the remove module 119 removes picket columns from a first feedforward matrix to form a second feedforward matrix. The first feedforward matrix may be an updated matrix that matches a previously generated second feedback matrix.

At 306, the deinterleave module 120 deinterleaves the second feedforward matrix to form a third feedforward matrix. At 308, the LDC decode module 122 attempts to decode the failed LDC codewords in the third feedforward matrix that satisfy the selected set of erasure class(es). The LDC decoding may also be based on other markings, pointers, and/or erasure set(s). The LDC decode module 122 generates a resultant matrix, which may be updated from a previously generated resultant matrix. The currently generated resultant matrix may include more corrected LDC bytes than the previously generated resultant matrix.

At 310, the LDC decode module 122, the marking module 117 and/or the evaluation module 124 may mark LDC codewords and/or LDC bytes in the resultant matrix generated at 308 as failed or corrected to indicate the decoding statuses of the bytes. Task 310 is similar to task 210 of FIG. 4. Task 310 may include tasks 210A-210F.

At 312, the evaluation module 124 evaluates the LDC codewords and/or LDC bytes of the resultant matrix based on the markings of the bytes. At 314, the evaluation module 124 determines whether there is another LDC codeword to attempt to decode. If there is not another LDC codeword to decode, the method may end at 316 and the resultant matrix may be sent to the drive control module 38. If there is another LDC byte and/or LDC codeword to decode, task 318 may be performed.

At 318, the reinterleave module 126 interleaves the resultant matrix to form the first feedback matrix. At 320, the reinsert module 128 inserts picket columns into the first feedback matrix to generate the second feedback matrix. The picket columns may be the same as the picket columns removed at 304 or may be generated based on the first feedback matrix and/or the picket columns removed at 304. Task 300 may be performed subsequent to task 320.

Figure 8:
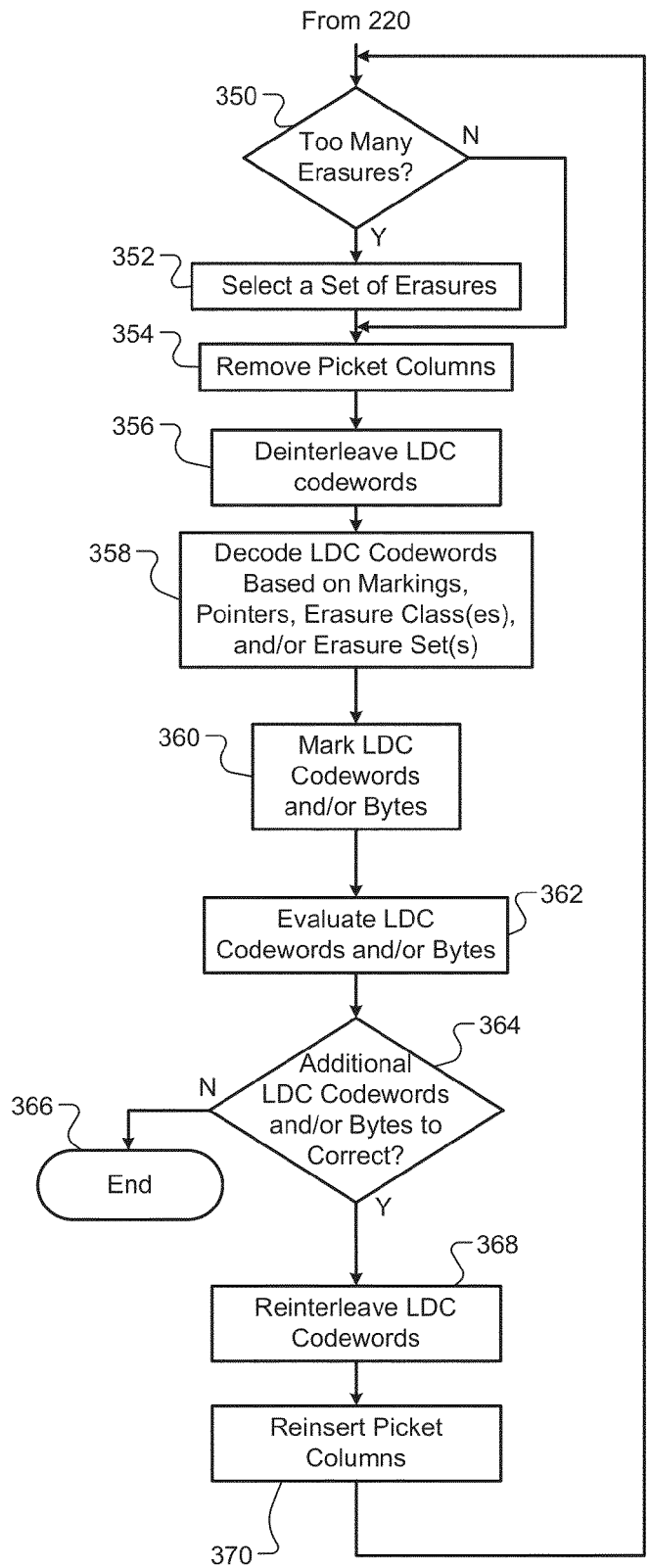
FIG. 8 illustrates an ECC decoding method incorporating erasure subset selection in accordance with the present disclosure.

In FIG. 8, an ECC decoding method incorporating erasure subset selection is shown. The following tasks may be performed instead of tasks 222-228 of FIG. 4. Although the following tasks are primarily described with respect to the implementations of FIGS. 2-4, the tasks may be easily modified to apply to other implementations of the present disclosure. The tasks may be iteratively performed.

At 350, the marking module 117, LDC decode module 122 and/or evaluation module 124 may determine whether a current matrix (e.g., the second feedback matrix) has too many erasures. A matrix may have too many erasures when there are not enough parity bytes in the matrix to correct the erasures. If there are too many erasures, task 352 is performed, otherwise task 354 is performed.

At 352, the marking module 117, LDC decode module 122 and/or evaluation module 124 selects one or more set(s) of the erasures based on various parameters. The parameters may include a number of parity bytes in the second feedback matrix (or updated first feedforward matrix), locations of the erasures in the matrix, statuses of bytes adjacent to the erasures, and statuses of bytes proximate to the erasures. The erasures in the set(s) of erasures selected may satisfy one or more classes of erasures and/or may not satisfy any of the classes of erasures.

At 354, the remove module 119 removes picket columns from a first feedforward matrix to form a second feedforward matrix. At 356, the deinterleave module 120 deinterleaves the second feedforward matrix to form a third feedforward matrix.

At 358, the LDC decode module 122 attempts to decode the failed LDC bytes in the third feedforward matrix that are in the selected set of erasures. The LDC decoding may also be based on other markings, pointers, and/or erasure set(s). The LDC decode module 122 generates a resultant matrix, which may be updated from a previously generated resultant matrix. The currently generated resultant matrix may include more corrected LDC bytes than the previously generated resultant matrix.

At 360, the marking module 117, the LDC decode module 122, and/or the evaluation module 124 may mark LDC codewords and/or LDC bytes in the resultant matrix generated at 358 as failed or corrected to indicate the decoding statuses of the bytes. Task 360 is similar to task 210 of FIG. 4. Task 360 may include tasks 210A-210F.

At 362, the evaluation module 124 evaluates the LDC codewords and/or LDC bytes of the resultant matrix based on the markings of the bytes. At 364, the evaluation module 124 determines whether there is another LDC codeword to attempt to decode. If there is not another LDC codeword to decode, the method may end at 366 and the resultant matrix may be sent to the drive control module 38. If there is another LDC byte and/or LDC codeword to decode, task 368 may be performed.

At 368, the reinterleave module 126 interleaves the resultant matrix to form the first feedback matrix. At 370, the reinsert module 128 inserts picket columns into the first feedback matrix to generate the second feedback matrix. The picket columns may be the same as the picket columns removed at 354 or may be generated based on the first feedback matrix and/or the picket columns removed at 354. Task 350 may be performed subsequent to task 370.

Figure 9:
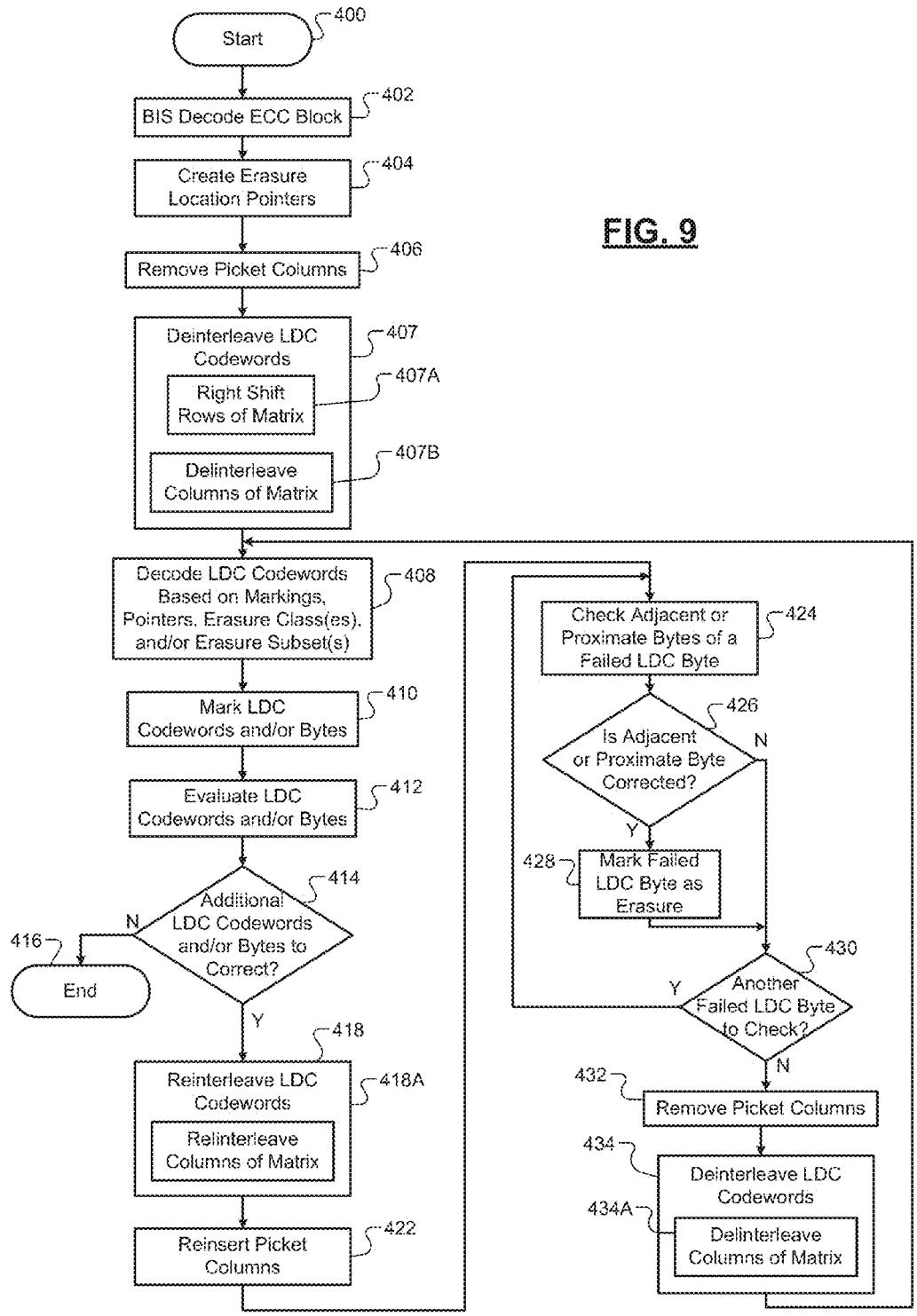
FIG. 9 illustrates a decoding method with varying levels of deinterleaving in accordance with the present disclosure.

In FIG. 9, a decoding method with varying levels of deinterleaving is shown. Although the following tasks are primarily described with respect to the implementations of FIGS. 2-3, the tasks may be easily modified to apply to other implementations of the present disclosure. The tasks may be iteratively performed. The method may begin at 400.

At 402, the BIS decode module 115 decodes BIS codewords in the demodulated signal received from the ECC decoder 113 to generate a first feedforward matrix (or ECC block). At 404, BIS decode module 115 and/or the marking module 117 creates erasure location pointers (or erasures) based on the first feedforward matrix. The erasures may be generated based on bytes in picket columns of the first feedforward matrix, a BIS, and/or a picket code. The bytes in the picket columns may include sync marks of a sync pattern and BIS bytes. This may include generating the flag table 138 or portions of the flag table 138 and storing the flag table 138 or portions of the flag table 138 in the memory 125.

At 406, the remove module 119 may remove picket columns from the first feedforward matrix to form a second feedforward matrix. At 407, the deinterleave module 120 deinterleaves the second feedforward matrix to generate the third feedforward matrix. This may include one or more levels of deinterleaving depending upon the number of levels of interleaving performed when the ECC block was encoded. In the example shown, two deinterleaving tasks are performed. The first deinterleaving task 407A includes right shift selected rows of the second feedforward matrix in a predetermined pattern. The second deinterleaving task 407B includes deinterleaving columns of the second feedforward matrix and/or result of the first deinterleaving task 407A to form the third feedforward matrix.

At 408, the LDC decode module 122 decodes LDC codewords and/or LDC bytes of the third feedforward matrix to generate a resultant matrix. This decoding may be performed based on the markings and/or pointers generated at for example, 404, 410, 426 and/or at other marking tasks, such as marking tasks described with respect to FIGS. 6-8. The LDC decode module 122 may also decode the LDC codewords and/or LDC bytes based on one or more selected erasure class(es) and/or one or more selected set(s) of erasures, as described above.

At 410, the marking module 117, the LDC decode module 122, and/or the evaluation module 124 may mark LDC codewords and/or LDC bytes of the resultant matrix as failed or corrected to indicate the decoding statuses of the bytes. Task 410 may include tasks 210A-210F of FIG. 4.

At 412, the evaluation module 124 evaluates the LDC codewords and/or LDC bytes of the resultant matrix based on the markings of the bytes. At 414, the evaluation module 124 determines whether there is another LDC byte and/or LDC codeword to attempt to decode. If there is not another LDC byte and/or LDC codeword to decode, the method may end at 416 and the resultant matrix may be sent to the drive control module 38. If there is another LDC byte and/or LDC codeword to decode, task 418 may be performed.

At 418, the reinterleave module 126 interleaves the resultant matrix to form the first feedback matrix. The reinterleave module 126 may perform one or more levels of interleaving, as described above. In the example shown, a single interleaving task 418A (or level) is performed. At 422, the reinsert module 128 inserts picket columns into the first feedback matrix to generate the second feedback matrix. The picket columns may be the same as the picket columns removed at 406 or may be generated based on the first feedback matrix and/or the picket columns removed at 406.

At 424, the marking module 117 checks adjacent and/or proximate (BIS or LDC) bytes of a failed LDC byte selected to be corrected. The marking module 117 determines which of the adjacent bytes and/or proximate bytes have been corrected, are marked as failed bytes, and/or are erasures. Bytes that are correct may be marked with a value of 0, bytes that have been corrected may be marked with a value of 1, bytes that are failed may be marked with a value of 2, and bytes that are erasures may be marked with an e.

At 426, the marking module 117 may determine whether one or more adjacent and/or proximate bytes of the failed LDC byte are corrected. If one or more adjacent and/or proximate bytes have been corrected, task 428 may be performed, otherwise task 430 is performed. At 428, the failed LDC byte is marked as a failure.

At 430, the marking module 117 determines whether there is another failed LDC byte to check. If there is another failed LDC byte to check, task 424 is performed, otherwise task 432 is performed.

At 432, the remove module 119 removes picket columns of an updated first feedforward matrix (or the last second feedback matrix) to form an updated second feedforward matrix. At 434, the deinterleave module 120 deinterleaves LDC codewords and/or LDC bytes of the updated feedforward matrix to form an updated third feedforward matrix. This may include one or more levels of deinterleaving. In the example shown, a single deinterleaving task 434A (or level) is performed. Task 408 may be performed subsequent to task 434.

The method of FIG. 9 allows for interleaving and deinterleaving tasks to be eliminated while still providing improved decoding efficiency over traditional decoding techniques. Although there are fewer interleaving and deinterleaving tasks performed in the method of FIG. 9 than the method of FIG. 4, the resultant matrices of the method of FIG. 9 may have ordering discontinuities due to the lack interleaving and deinterleaving tasks performed.

The methods of FIGS. 4 and 6-9 provide efficient techniques of pinpointing incorrect bytes of a matrix, marking the bytes as failed and/or as erasures, and correcting the marked bytes. Bytes are marked based on decoding statuses of neighboring bytes (adjacent and/or proximate bytes) to allow LDC bytes between two consecutive and incorrect BIS bytes to be either not marked as erasures and/or to be corrected.

Referring again to FIG. 4, in another example implementation, erasures are generated from the BIS code (BIS-based erasures) as described at tasks 202 and 204 above. The picket columns are removed and the LDC codewords are deinterleaved, as described at tasks 206 and 207. Then each of the deinterleaved LDC codewords is decoded using one or more decoding methods. The decoding methods may include decoding using: the BIS-based erasures generated based on picket codes; and/or erasures generated based on corrections made on a previously decoded neighboring LDC codeword (adjacent and/or proximate codewords). An additional or alternative decoding method includes decoding each of the deinterleaved LDC codewords without using erasures.

As yet another example, for each of the deinterleaved LDC codewords and during a first decoding iteration, the LDC decode module may first select decoding methods of: using BIS-based erasures generated based on picket codes, using erasures generated based on corrections made on a previously decoded neighboring LDC codeword, and not using erasures. Additional decoding iterations may be performed if the first decoding iteration is unsuccessful in correctly decoding one or more of the LDC codewords. The additional decoding iterations may include the LDC decode module selecting one or more of the other decoding methods not performed in the first or previous decoding iteration.

For example, the LDC decode module may select during a first decoding iteration to use the decoding method including BIS-based erasures. If decoding a LDC codeword is unsuccessful during the first iteration, then during a second decoding iteration, the LDC decode module may perform the decoding method that includes erasures based on corrections made on a previously decoded neighboring codeword. If the second decoding iteration is unsuccessful, then the LDC decode module may decode one or more of the LDC codewords without using erasures.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

What is claimed is:

1. A decoder comprising:
a first decode module configured to (i) receive data, and (ii) perform a first decoding iteration to decode the data, wherein the first decoding iteration includes generating a first matrix, and wherein the first matrix includes a first byte;
a matrix module configured to generate a second matrix based on the first matrix, wherein the second matrix includes the first byte and a second byte, and wherein the second byte is (i) adjacent and sequentially prior to the first byte, or (ii) adjacent and sequentially subsequent to the first byte; and
a marking module configured to (i) subsequent to the first decoding iteration, determine whether the first byte of the first matrix has been correctly decoded, (ii) based on determining whether the first byte of the first matrix has been correctly decoded, determine a status of the second byte, and (iii) based on the status of the second byte, mark the first byte as an erasure,
wherein the first decode module is configured to (i) perform a second decoding iteration, and (ii) based on the second byte being marked as an erasure, correct the second byte during the second decoding iteration.

2. The decoder of claim 1, wherein:
the first matrix includes a decoded version of the data; and
the second matrix includes the decoded version of the data.

3. The decoder of claim 1, further comprising:
an evaluation module configured to (i) evaluate the first matrix based on decoding statuses of a plurality of bytes in the first matrix, and (ii) determine whether to perform the second decoding iteration based on the evaluation of the first matrix, wherein the plurality of bytes include the first byte and the second byte, and
an interleave module configured to interleave selected bytes of the first matrix to form a third matrix during the second decoding iteration; and
an insert module configured to insert columns in the third matrix to form the second matrix.

4. The decoder of claim 1, further comprising a second decode module configured to decode a demodulated version of the data to generate a third matrix during the first decoding iteration, wherein:
the second decode module or the marking module is configured to determine erasures of the third matrix; and
the decode module is configured to generate the first matrix based on the erasures of the third matrix.

5. The decoder of claim 4, further comprising:
a remove module configured to remove columns from the third matrix to generate a fourth matrix during the first decoding iteration; and
a deinterleave module configured to deinterleave the fourth matrix to generate a fifth matrix,
wherein the first decode module is configured to decode the fifth matrix to generate the first matrix.

6. The decoder of claim 1, further comprising:
a remove module configured to remove columns from a third matrix to generate a fourth matrix during the second decoding iteration, wherein the third matrix includes the second matrix;
a deinterleave module configured to deinterleave the fourth matrix to generate a fifth matrix,
wherein the first decode module is configured to decode the fifth matrix to generate a sixth matrix; and
an evaluation module configured to determine whether to perform an additional decoding iteration based on decoding statuses of bytes in the sixth matrix.

7. The decoder of claim 6, wherein:
the marking module is configured to mark the bytes in the sixth matrix as corrected bytes or failed bytes; and
the evaluation module is configured to evaluate the corrected bytes and the failed bytes of the sixth matrix to determine whether to perform the additional decoding iteration.

8. The decoder of claim 1, wherein:
the marking module is configured to (i) determine whether a plurality of failed bytes of the second matrix are in one or more erasure classes, and (ii) select one of the erasure classes; and
the first decode module is configured to correct one or more of the plurality of failed bytes in the selected one of the erasure classes during the second decoding iteration.

9. The decoder of claim 1, wherein:
the marking module is configured to (i) select one or more erasure classes for the second decoding iteration, and (ii) determine whether a plurality of failed bytes of the second matrix satisfy the selected one or more erasure classes; and
the first decode module is configured to correct one or more of the plurality of failed bytes satisfying the selected one or more erasure classes.

10. The decoder of claim 9, wherein:
the marking module is configured to select one or more erasure classes for a third decoding iteration, wherein the selected one or more erasure classes for the third decoding iteration are different than the selected one or more erasure classes used during the second decoding iteration; and
the first decode module is configured to correct one or more failed bytes satisfying the selected one or more erasure classes for the third decoding iteration.

11. The decoder of claim 9, wherein:
the marking module is configured to (i) determine whether a number of the erasures is greater than a predetermined number, and (ii) select a set of the erasures; and
the first decode module is configured to correct one or more bytes corresponding to the set of the erasures during the second decoding iteration.

12. The decoder of claim 11, wherein:
the marking module is configured to (i) determine whether a number of erasures associated with an updated version of the second matrix and generated during a third decoding iteration is greater than the predetermined number, and (ii) select a second set of the erasures corresponding to bytes in the updated version of the second matrix; and
the first decode module is configured to correct one or more bytes corresponding to the second set of the erasures during the third decoding iteration.

13. The decoder of claim 1, further comprising a deinterleave module configured to perform:
a first number of levels of deinterleaving during the first decoding iteration; and
a second number of levels of deinterleaving during the second decoding iteration, wherein the second number of levels of deinterleaving is less than the first number of levels of deinterleaving.

14. The decoder of claim 1, further comprising:
a deinterleave module configured to (i) deinterleave columns of a third matrix during the first decoding iteration, and (ii) shift rows of the third matrix to generate a fourth matrix,
wherein the first decode module is configured to decode bytes of the fourth matrix to generate the first matrix; and an interleave module configured to interleave columns of the first matrix to form a fifth matrix without shifting rows of the first matrix, wherein the fifth matrix is generated based on the second matrix.

15. The decoder of claim 14, further comprising a remove module configured to remove the columns from the fifth matrix to form the third matrix.

16. A system comprising:
the decoder of claim 1; and
a demodulation decoder configured to demodulate the data to generate demodulated data, wherein the first decode module is configured to (i) receive the demodulated data, and (ii) perform the first decoding iteration and the second decoding iteration to decode the demodulated data.

17. A method comprising:
receiving data at a decoder;
performing a first decoding iteration, via the decoder, to decode the data, wherein the first decoding iteration includes generating a first matrix, and wherein the first matrix includes a first byte;
generating a second matrix based on the first matrix, wherein the second matrix includes the first byte and a second byte, and wherein the second byte is (i) adjacent and sequentially prior to the first byte, or (ii) adjacent and sequentially subsequent to the first byte;
subsequent to the first decoding iteration, determining whether the first byte of the first matrix has been correctly decoded;
based on determining whether the first byte of the first matrix has been correctly decoded, determining a status of the second byte;
based on the status of the second byte, marking the first byte as an erasure;
performing a second decoding iteration via the decoder; and
based on the second byte being marked as an erasure, correcting the second byte during the second decoding iteration.

18. The method of claim 17, further comprising:
evaluating the first matrix based on decoding statuses of a plurality of bytes in the first matrix;
determining whether to perform the second decoding iteration based on the evaluation of the first matrix, wherein the plurality of bytes include the first byte and the second byte;
interleaving selected bytes of the first matrix to form a third matrix during the second decoding iteration; and
inserting columns in the third matrix to form the second matrix.

19. The method of claim 17, further comprising:
removing columns from a third matrix to generate a fourth matrix during the second decoding iteration, wherein the third matrix includes the second matrix;
deinterleaving the fourth matrix to generate a fifth matrix;
decoding the fifth matrix to generate a sixth matrix;
determining whether to perform an additional decoding iteration based on decoding statuses of bytes in the sixth matrix;
marking the bytes in the sixth matrix as corrected bytes or failed bytes; and
evaluating the corrected bytes and the failed bytes of the sixth matrix to determine whether to perform the additional decoding iteration.

20. The method of claim 17, further comprising:
selecting one or more erasure classes for the second decoding iteration;
determining whether a plurality of failed bytes of the second matrix satisfy the selected one or more erasure classes;
correcting one or more of the plurality of failed bytes satisfying the selected one or more erasure classes;
determining whether a number of the erasures is greater than a predetermined number, and (ii) select a set of the erasures;
correcting one or more bytes corresponding to the set of the erasures during the second decoding iteration;
determining whether a number of erasures associated with an updated version of the second matrix and generated during a third decoding iteration is greater than the predetermined number;
selecting a second set of the erasures corresponding to bytes in the updated version of the second matrix; and
correcting one or more bytes corresponding to the second set of the erasures during the third decoding iteration.

* * * * *